(12) United States Patent
Boccardi et al.

(10) Patent No.: US 9,041,149 B2
(45) Date of Patent: May 26, 2015

(54) GRINGO HETEROJUNCTION BIPOLAR TRANSISTOR WITH A METAL EXTRINSIC BASE REGION

(75) Inventors: Guillaume Boccardi, Lueven (BE); Mark C. J. C. M. Kramer, Sittard (NL); Johannes J. T. M. Donkers, Valkenswaard (NL); Li Jen Choi, Mountain View, CA (US); Stefaan Decoutere, Haasrode (BE); Arturo Sibaja-Hernandez, Heverlee (BE); Stefaan Van Huylenbroeck, Kessel-Lo (BE); Rafael Venegas, Heverlee (BE)

(73) Assignee: NXP, B.V., Eindhoven (NL)

( * ) Notice: Subject to any disclaimer, the term of this patent is extended or adjusted under 35 U.S.C. 154(b) by 512 days.

(21) Appl. No.: 13/059,277

(22) PCT Filed: Aug. 5, 2009

(86) PCT No.: PCT/IB2009/053401
§ 371 (c)(1),
(2), (4) Date: May 3, 2011

(87) PCT Pub. No.: WO2010/020897
PCT Pub. Date: Feb. 25, 2010

(65) Prior Publication Data
US 2011/0198671 A1  Aug. 18, 2011

(30) Foreign Application Priority Data
Aug. 19, 2008 (EP) ..................................... 08162603
Oct. 15, 2008 (EP) ..................................... 08166641

(51) Int. Cl.
*H01L 21/70* (2006.01)
*H01L 29/10* (2006.01)
(Continued)

(52) U.S. Cl.
CPC ........ *H01L 29/1004* (2013.01); *H01L 21/8249* (2013.01); *H01L 27/0623* (2013.01); *H01L 29/66242* (2013.01); *H01L 29/66287* (2013.01)

(58) Field of Classification Search
CPC ............ H01L 29/732; H01L 29/66242; H01L 29/0821
USPC .......... 257/196, 565, 588, 197, 526; 438/235, 438/309, 312
See application file for complete search history.

(56) References Cited

U.S. PATENT DOCUMENTS 5,648,280 A * 7/1997 Kato .............................. 438/312
5,789,800 A * 8/1998 Kohno .......................... 257/588

(Continued)

FOREIGN PATENT DOCUMENTS

WO  2007000693 A2  1/2007
WO  2007144828 A1  12/2007

OTHER PUBLICATIONS

B. Sell et al., Chemical vapor deposition of tungsten silicide WSix for high aspect ratio applications, Thin Solid Films 443 (2003) 97-107.

(Continued)

*Primary Examiner* — Eugene Lee
*Assistant Examiner* — Fang-Xing Jiang (57) ABSTRACT

The invention relates to a semiconductor device (30) comprising a substrate (1), a semiconductor body (25) comprising a bipolar transistor that comprises a collector region (3), a base region (4), and an emitter region (15), wherein at least a portion of the collector region (3) is surrounded by a first isolation region (2, 8), the semiconductor body (25) further comprises an extrinsic base region (35) arranged in contacting manner to the base region (4). In this way, a fast semiconductor device with reduced impact of parasitic components is obtained.

17 Claims, 9 Drawing Sheets

(51) Int. Cl.
*H01L 21/8249* (2006.01)
*H01L 27/06* (2006.01)
*H01L 29/66* (2006.01)

(56) References Cited

U.S. PATENT DOCUMENTS

| | | |
|---|---|---|
| 7,119,416 B1 | 10/2006 | Adam et al. |
| 7,906,403 B2 | 3/2011 | Donkers et al. |
| 8,373,236 B2 | 2/2013 | Hijzen et al. |
| 8,405,186 B2 * | 3/2013 | Camillo-Castillo et al. .. 257/526 |
| 2001/0017399 A1 * | 8/2001 | Oda et al. ...................... 257/565 |
| 2005/0012180 A1 * | 1/2005 | Freeman et al. ............... 257/565 |
| 2005/0199907 A1 | 9/2005 | Divakaruni et al. |
| 2005/0236647 A1 | 10/2005 | Khater |
| 2006/0065951 A1 | 3/2006 | Khater |
| 2008/0164495 A1 | 7/2008 | Cohen et al. |

OTHER PUBLICATIONS

B. Barbalat et al., "Experimental study of metallic emitter SiGeC HBTs"; IEEE BCTM 13.3; 2006.

Lear, K.L et al.; "Oxide defined AlAsSb/InGaAs/InP heterojunction bipolar transistors with a buried metal extrinsic base"; Device Research Conference Digest, pp. 66-67, 1997.

* cited by examiner

GRINGO HETEROJUNCTION BIPOLAR TRANSISTOR WITH A METAL EXTRINSIC BASE REGION

FIELD OF THE INVENTION

The invention relates to the field of semiconductor devices and methods of manufacturing such semiconductor devices that can be used as amplifiers, comprising a collector-and-base GRown-IN-1-GO (GRINGO) heterojunction bipolar transistor (HBT) adapted for RF applications.

BACKGROUND OF THE INVENTION

It is generally known that a continuing increase in carrier frequency for new RF applications is required. This is due to the need to realize higher data rates and to the fact that lower frequency bands are becoming more and more congested. The increase in frequency pushes the required cut-off frequency of RF technologies to increasingly higher values. Important Figure of merits (FOMs) in RF applications are the maximum frequencies for current gain $f_T$, power gain $f_{max}$ and voltage gain $f_A$, respectively.

It goes without saying that the HBT is an improvement of the bipolar junction transistor (BJT) that handles signals of high frequencies up to several hundred GHz. The HBT is common in modern ultra-phase circuits, preferably in RF systems. A main difference between the HBT and the BJT is the use of different semiconductor materials for the emitter and base regions which thus creates a heterojunction.

The portion of integrated circuit fabrication (BiCMOS technology) where the active components, such as transistors or resistors, are interconnected with wiring on the wafer is called back-end-of-the-line (BEOL). BEOL generally begins when the first layer of metal is deposited on the wafer. It includes contacts, insulator, metal levels and bonding sites for chip-to-package connections.

Since the total epi stack (also called total epitaxial layer stack) of the HBT, i.e. collector and base, is grown in one go, the HBT is called GRINGO HBT. The HBT is usually grown on top of predefined active areas, resulting in a device protruding from the CMOS active area surface. Through this protrusion the chemical mechanical planarization (CMP) steps required for manufacturing the HBT does not affect the CMOS area, making this implementation well compatible with CMOS and therefore suitable as a true BiCMOS technology. The grown epi stack is typically patterned with a dummy emitter pedestal making the whole device structure self-aligned to the emitter. The base connection can be made by diffusion from a boron-doped poly-Si layer. This enables a low base resistance down to 100 Ωμm and a very steep lateral doping profile. The collector connection can be done by a "buried layer" type of implant but also with other, less highly doped, implants, such as the already present n-well implant. In CMOS technology a "twin tub" process is utilized to form a discrete, p-type well region ("p-well" in short) into which e.g. an NFET (n-doped field effect transistor) can be formed, and a discrete, n-type well region ("n-well" in short) into which e.g. a PFET (p-doped field effect transistor) can be formed.

An integration scheme of a GRINGO HBT is described in the following: After forming Shallow Trench Isolation (STI) regions and CMOS gate stack deposition the gate stack is patterned either already for defining the CMOS transistors or, preferably, to open up the areas for the HBTs. Subsequently, a seed layer is deposited and patterned. This seed layer typically is an oxide-nitride stack and also serves as a CMOS protection layer. Next, the HBT collector and base epi are grown. Then, the dummy emitter pedestal stack is deposited, consisting typically of oxide-nitride or oxide-nitride-oxide. The dummy emitter is patterned with a resist mask and the underlying silicon is etched down to the seed layer, removing it everywhere except underneath the dummy emitter. Then, a high density plasma (HDP) oxide is deposited, possibly preceded by a thin nitride liner. The HDP oxide is subsequently planarized with CMP. It is noted that dummy structures for CMP are usually required for obtaining reasonable thickness uniformity. Further, the HDP oxide is etched down by, for instance, an HF etch to a level below the intrinsic base. If the nitride liner is present it is etched subsequently. Then an in-situ boron-doped poly-Si layer is deposited and planarized with CMP down to or above the dummy emitter pedestal top level. A dry etch is then used to etch the poly-Si such that its top surface is touching the nitride of the dummy emitter pedestal, for instance half-way. The poly-Si is then oxidized, using for instance wet oxidation. Finally, the dummy emitter is removed, preferably using wet etch, and inside spacers are formed in the created emitter window. The emitter is defined by either epitaxial growth or poly-Si deposition. The emitter is subsequently patterned and the oxide on top of the base poly-Si is removed. The base poly-Si is then etched as well as the underlying HDP oxide, all selectively towards this CMOS protection layer. The seed layer is removed by a wet etch and conventional processing continuous, i.e. gate patterning, source/drain formation, silicidation and standard back-end processing.

An HDP oxide is a silicon oxide ($SiO_2$) layer deposited using a Plasma Enhanced Chemical Vapor Deposition (PECVD) technique. An HDP oxide is capable of filling wide trenches without creating a void and is usually used in STI trench filling. Thus, an HDP oxide layer corresponds to an electrically insulating layer.

Figure 1:
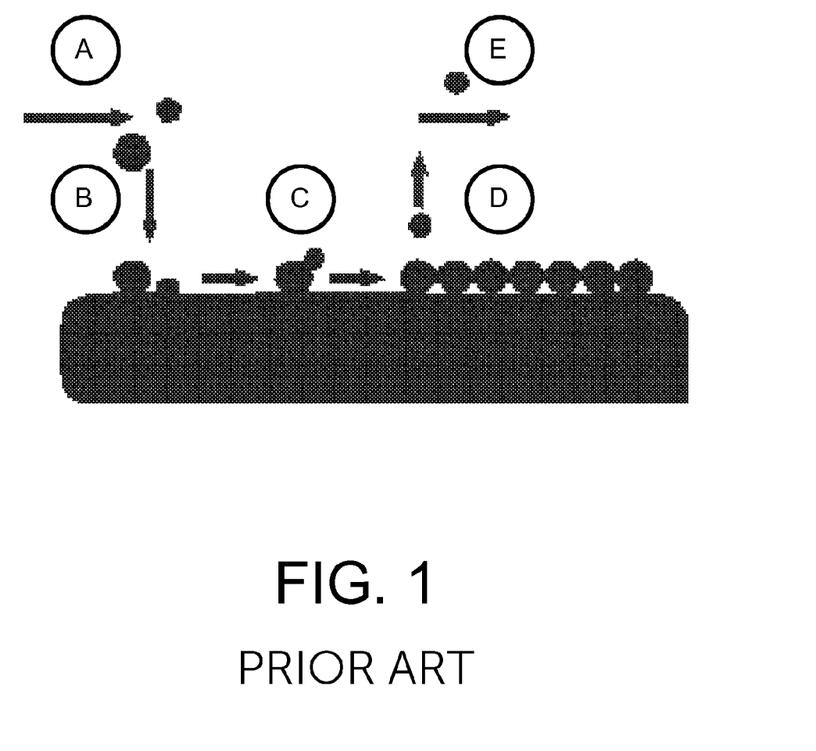
FIG. 1 illustrates a CVD technique.

FIG. 1 illustrates the elementary processes involved in a Chemical Vapor Deposition (CVD) technique. In step A of FIG. 1 the transport of the precursor(s) with the carrier gas to the reaction chamber and to the wafer surface is depicted. In this step, convection and diffusion are the main processes involved. In step B adsorption or chemisorptions of the precursor(s) at the wafer surface occurs. Then, in step C chemical surface reaction including dissociation and surface diffusion occurs, followed by step D, during which film growth, desorption of volatile reaction products, transport of reaction products away from the wafer surface, i.e. diffusion, is involved. Finally, in step E the transport of reaction products with the carrier gas out of the reactor occurs. To sum up, the CVD process involves chemical reactions and, thus, an activation (i.e. an energy source) is required. In the PECVD technique, on the other hand, the required energy source is provided through a plasma. The advantages of PECVD are its high deposition rate and its low deposition temperature which typically is approx. 250° C. to 400° C.

In general, it is difficult to increase the maximum frequencies and, thus, the speed of the intrinsic device of a bipolar transistor. At the same time care has to be taken on reducing the impact of parasitic components attributed to the extrinsic parts of the semiconductor device. The extrinsic collector-base capacitance and the base resistance have a large impact in this respect. Reduction of these parasitic components is therefore the main driver behind the improvement in speed obtained in BiCMOS technologies.

In WO 2007/144828 A1 a semiconductor device with a substrate and a semiconductor body comprising a bipolar transistor with in that order a collector region, a base region, and an emitter region is provided. The semiconductor body comprises a projecting mesa comprising at least a portion of the collector region and the base region, which mesa is surrounded by an isolation region. The semiconductor device also comprises a field effect transistor (FET) with a source region, a drain region, an interposed channel region, a superimposed gate dielectric, and a gate region, which gate region forms a highest part of the FET, and the height of the mesa is larger than the height of the gate region. Therefore, the bipolar transistor has been defined with an intrinsic part while the parasitic contributions of the extrinsic parts have been decreased.

In US 2005/0199907 A1 a structure and a method are described for making a bipolar transistor, wherein the bipolar transistor includes a collector, an intrinsic base overlying the collector, an emitter overlying the intrinsic base, and an extrinsic base spaced from the emitter by a gap. The gap includes at least one of an air gap and a vacuum void.

SUMMARY OF THE INVENTION

It is the object of the invention to provide a possibility to improve the speed of bipolar transistors. An advantage of the present invention is to reduce the impact of the parasitic components and, thus, to improve the speed of bipolar transistors.

This object is achieved by a semiconductor device comprising: a substrate, a semiconductor body comprising a bipolar transistor that comprises a collector region, a base region, and an emitter region, wherein at least a portion of the collector region is surrounded by a first isolation region, the semiconductor body further comprises an extrinsic base region arranged in contacting manner to the base region.

The term "contacting manner" means that there is no gap between the extrinsic base region and the base and, thus, the extrinsic base region is in direct contact with the (intrinsic) base. The extrinsic base is preferably not in direct contact with the emitter. For example, there can be an insulating layer such as an oxide layer between the emitter and the extrinsic base. The bipolar transistor comprises, most preferably in the following order, a collector region, a base region, and an emitter region. However, by changing the orientation of the semiconductor device the order of the regions comprised by the bipolar transistor may differ.

The semiconductor body preferably further comprises a dummy emitter layer and a seed layer that preferably comprises at least one of a silicon dioxide layer and a silicon nitride layer.

According to another preferred embodiment of the invention, the extrinsic base region comprises at least one of a thermal oxide and most preferably a high density plasma (HDP) oxide arranged on top of the dummy emitter layer. It is noted that the HDP oxide is preferably thicker than the thermal oxide, only limited by the base poly consumption, which thus reduces the base-emitter overlap capacitance and further improves the maximum frequency for current gain $f_T$. Further, the replacement of thermal oxide on the extrinsic base by preferably an HDP oxide improves $f_T$ since it allows the reduction of the thermal budget. In a preferred embodiment of the invention, the HDP oxide corresponds to a second isolation region.

According to yet another preferred embodiment of the invention, the extrinsic base region comprises one of the following structures: a stack of a p-doped polycrystalline semiconductor layer, such as a boron-doped poly-Si layer, and a polycrystalline alloy layer, such as a poly-SiGe layer; or a polycrystalline alloy layer, such as a poly-SiGe layer; or a stack of a p-doped polycrystalline semiconductor layer, a silicon dioxide layer ($SiO_2$ layer in short) and an undoped polycrystalline semiconductor layer, such as an undoped poly-Si layer.

Preferably, at least one of a polycrystalline alloy layer, such as a poly-SiGe layer or a silicon dioxide layer and an undoped polycrystalline semiconductor layer, all comprised by the extrinsic base region, correspond to a sacrificial layer being removable. Most preferably, the sacrificial layer is removed and the extrinsic base region further comprises a metal layer. It is noted that no extrinsic base is consumed and, thus, the sacrificial extrinsic base poly layer is preferably thicker than the thickness of the thermal oxide. Therefore, the base resistance $R_B$ is further reduced and the maximum frequency for power gain $f_{max}$ increases as well.

It goes without saying that the inventive idea is applicable to bipolar transistors in general. Most preferably, the bipolar transistor corresponds to one of an HBT and a GRINGO HBT.

It is worth noting that the extrinsic base region of the semiconductor device is adapted for providing at least one of a low collector-base capacitance and a low base resistance, adapted for providing a high maximum frequency of the bipolar transistor. Most preferably, the high maximum frequency corresponds to at least one of a high current gain, a high power gain and a high voltage gain of the bipolar transistor.

According to another aspect of the invention a method of manufacturing a semiconductor device is provided. The method comprises the steps: a) providing a substrate and forming a collector region, a base region, and an emitter region being adapted for providing a bipolar transistor, b) forming a first isolation region surrounding at least a portion of the collector region, and c) forming an extrinsic base region arranged in contacting manner to the base region of the bipolar transistor.

According to another preferred embodiment of the invention, the method further comprises the step of forming a sacrificial layer arranged inside the extrinsic base region. Most preferably, the method further comprises the step of removing the sacrificial layer from the extrinsic base region after depositing a pre-metal dielectric (PMD) layer on top of the extrinsic base region.

According to yet another preferred embodiment of the invention, the method further comprises the steps of planarizing by applying CMP, and dry etching contact holes and/or contact stripes being adapted for forming a cavity inside the extrinsic base region. Most preferably, further at least one of inside spacers and SINGEN spacers are provided and are arranged adjacent to the extrinsic base region. SINGEN spacers are preferably fabricated by applying low pressure chemical vapor deposition (LPCVD) followed by an anisotropic etch, such as dry etch.

In yet another preferred embodiment of the invention, further a tungsten layer is deposited on top of the extrinsic base region for filling the contact holes and/or contact stripes. Preferably, further silicide spacers are formed that are arranged adjacent to the tungsten layer.

The invention is particularly suitable in RF applications, preferably in a high-frequency amplifier comprising a heterojunction bipolar transistor, for use above 50 GHz, e.g. in a 60 GHz wireless local area network (WLAN) and/or in a 77 GHz car radar.

Accordingly, it is an important idea of the invention to provide a possibility to implement an extrinsic base region, which consists preferably of a metal, for instance in fully self-aligned bipolar transistors. A sacrificial layer is thus incorporated into the extrinsic base region and replaced preferably by a metal layer. This is preferably done in the BEOL module.

It is worth noting that the inventive idea is applicable with GRINGO integration schemes. The implementation of a metal extrinsic base strongly improves the maximum frequencies for power gain $f_{max}$ and voltage gain $f_A$, respectively. This is due to the fact that the extrinsic base resistance is strongly reduced. Therefore, the metal connection, i.e. the low resistive connection, is brought closer to the intrinsic device than in case of a standard silicidation where the distance between the silicide, i.e. the compound comprising silicon with more electro-positive elements, and the intrinsic device is determined by the emitter overlap on the extrinsic base.

Finally, it is worth mentioning that the invention provides a high speed intrinsic part of a semiconductor device showing high maximum frequencies for current gain, for power gain and/or for voltage gain, respectively, corresponding to a decrease of the impact of parasitic components, i.e. decreasing the extrinsic collector-base capacitance and the base resistance of the extrinsic part of the device. Further, a possibility to implement a metal extrinsic base region in the GRINGO integration scheme of HBTs in BiCMOS technologies and for replacing a thermal oxide on the extrinsic base region by an HDP oxide has been provided. Preferred embodiments are described in the sub claims.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

In the following detailed description of the preferred embodiments, reference is made to the accompanying drawings, which form a part hereof, and within which are shown by way of illustration specific embodiments by which the invention may be practiced. The drawings described are only schematic and are non-limiting. In the drawings, the size of some of the elements may be exaggerated and not drawn on scale for illustrative purposes. Those skilled in the art will recognize that other embodiments may be utilized and structural changes may be made without departing from the scope of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

It is worth noting that standard process conditions are used in all embodiments of the invention. In the following, three different embodiments to realize the extrinsic base region of GRINGO HBTs will be described in more detail.

Moreover, it will be appreciated that in other embodiments other materials or other layer configurations than those that will be described in the following are employed.

In particular, although in embodiments of the present invention, Si or SiGe semiconductor substrates will be used to exemplify the invention, the term "substrate" may include any underlying material or materials that may be used, or upon which a device, a circuit or an epitaxial layer may be formed. In other alternative embodiments, such a "substrate" as used in this document may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a semiconductor layer is formed.

In a first embodiment of the invention (see FIGS. 2 to 6), it is shown that the boron-doped poly extrinsic base is partially or completely replaced by a metal extrinsic base. Since this metal layer typically is implemented in the BEOL, sacrificial layers, such as poly-SiGe or undoped poly-Si on $SiO_2$, which are subsequently removed and replaced by a metal layer, are used. This first embodiment applies a boron-doped poly-Si and poly-SiGe stack.

In a second embodiment of the invention (see FIGS. 7 to 11), a boron-doped poly-Si, silicon dioxide ($SiO_2$) and undoped poly-Si stack is used to form the extrinsic base region. In another embodiment only a poly-SiGe sacrificial layer is used. In the second embodiment the intrinsic SiGe base (region) is, at least partially, etched away once the sacrificial layer is removed (see FIG. 10). In a third embodiment of the invention (see FIGS. 12 to 17), on the other hand, spacers are used to avoid a lateral etch of the intrinsic SiGe base which is typically grown using epitaxy.

Figure 2:
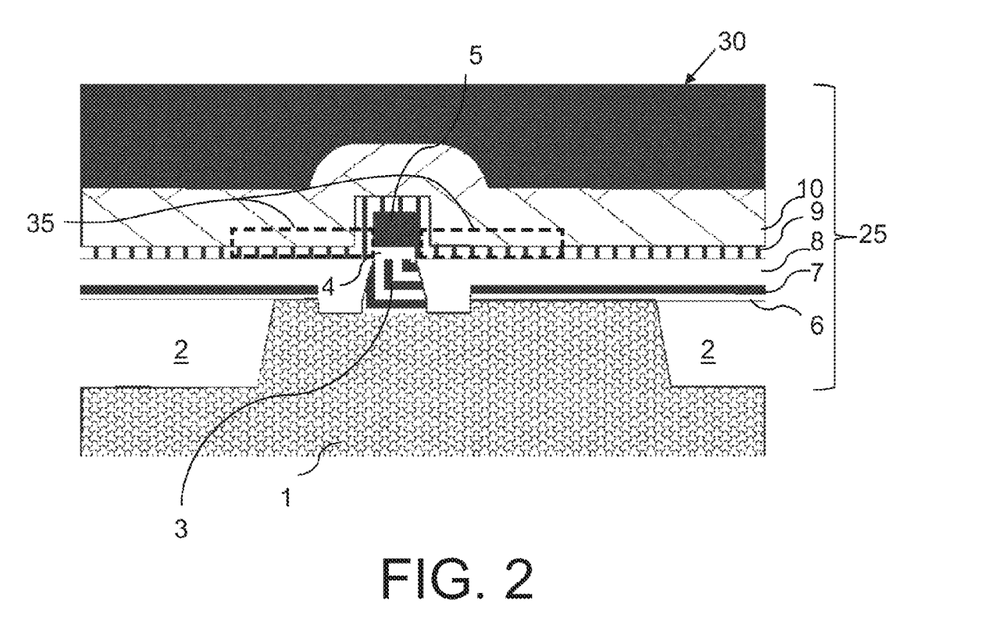
FIG. 2 shows a boron-doped poly-Si and poly-SiGe layer deposition according to a first embodiment of the invention.

After HDP oxide planarization and etch-back a stack comprising a p-doped (in this embodiment boron-doped) poly-Si layer 9 and a poly-SiGe layer 10 is deposited as shown in FIG. 2 illustrating a first embodiment of the invention. In this first embodiment an extrinsic base region 35 includes the poly-Si layer 9 and the poly-SiGe layer 10. The semiconductor device 30 comprises a substrate 1, which is a silicon substrate in this embodiment, and a semiconductor body 25. The layer thicknesses of layers 9 and 10 are about 20 nm and 350 nm, respectively. In another embodiment only a poly-SiGe layer 10 is deposited leading to a complete poly-SiGe extrinsic base. In FIG. 2 an STI region 2 that comprises an HDP oxide with 325 nm deep trenches is shown which together with the HDP oxide layer 8 corresponds to a first isolation region of the semiconductor device 30. The collector and base are grown in one go and thus the total epi stack of the GRINGO HBT comprises a collector region 3 and an (intrinsic) base region 4, wherein the collector region 3 comprises an Si layer of 150 nm thickness and the base region 4 comprises an SiGe layer of 25 nm thickness. FIG. 2 also shows a seed layer comprising an insulating stack used as a nucleation layer for an epitaxy step, e.g. a $SiO_2$ layer 6 and an $Si_3N_4$ layer 7 in this embodiment, wherein both layers show a thickness of about 20 nm leading to a total thickness of about 40 nm of the seed layer. A dummy emitter (region) 5 is shown in FIG. 2 as well and comprises any suitable layer that can be removed selectively from the underlying semiconductor layer, e.g. such a layer or stack can be made from an $Si_3N_4$ layer of 150 nm thickness on silicon dioxide ($SiO_2$) with a thickness of 3 nm. The dummy emitter is typically formed after the epi process (epitaxy). The poly-SiGe or any other material that can be selectively etched at a high rate compared to the underlying semiconductor layer, e.g. Si is used as a sacrificial layer and is replaced by a metal layer in the BEOL part of the process.

Figure 3:
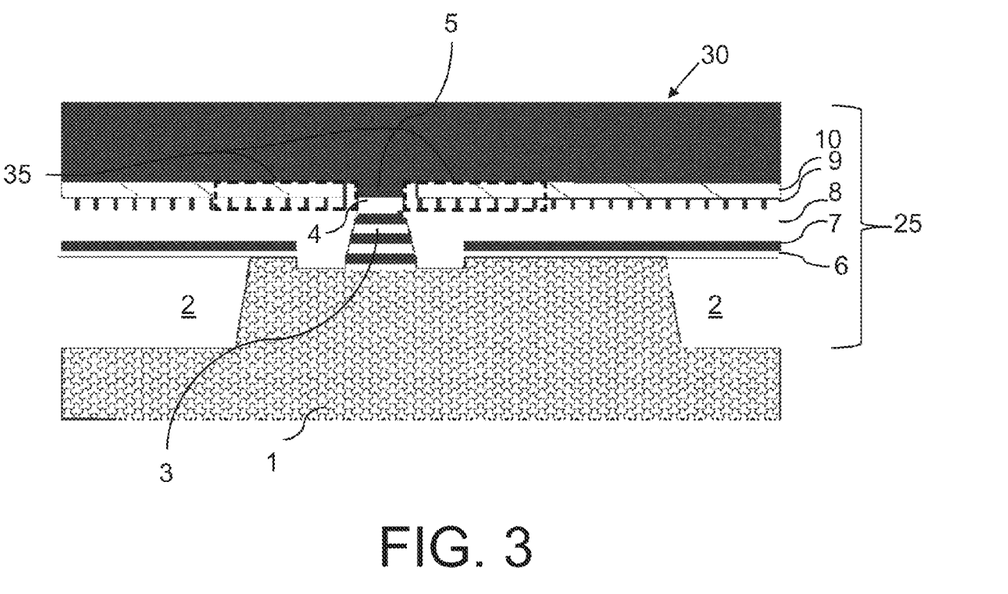
FIG. 3 shows a poly-SiGe planarization and etch-back according to the first embodiment of the invention.

Next, as depicted in FIG. 3 according to the first embodiment, a polishing process such as CMP is used to planarize the layer stack down to or above the dummy emitter 5 top level. FIG. 3 shows the situation after applying a dry etch to recess the poly-SiGe layer 10 to a level half-way the dummy emitter 5.

Figure 4:
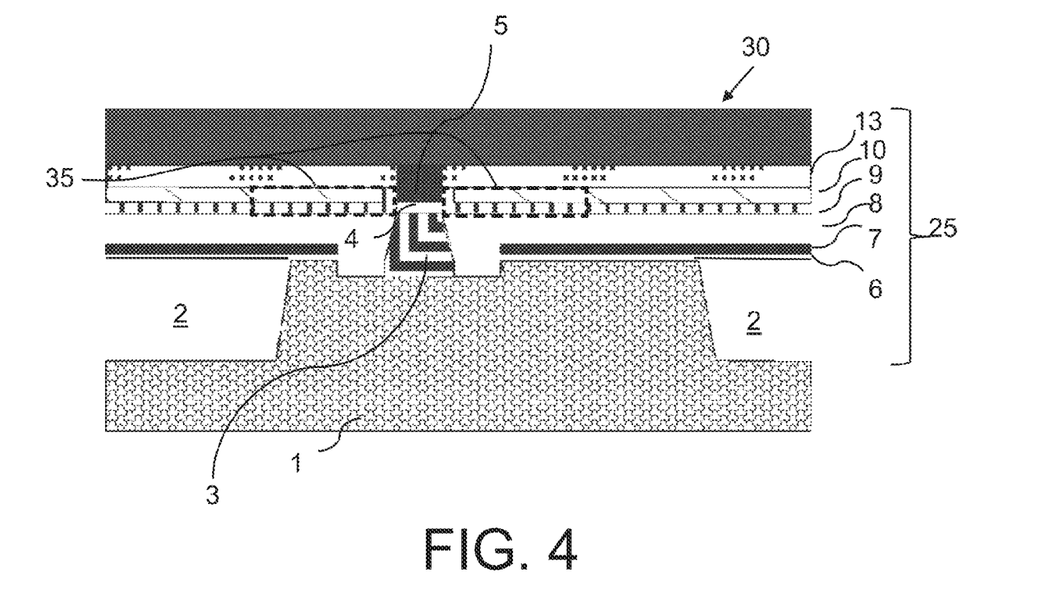
FIG. 4 illustrates HDP oxide deposition and planarization according to the first embodiment of the invention.

FIG. 4 depicts the deposition of an insulating layer such as an HDP oxide layer 13. In this first embodiment the HDP oxide layer 13 shows a thickness of about 120 nm. A planarization of the whole structure with a polishing process such as CMP is also performed. The remaining front-end-of-the-line (FEOL) processing steps have already been mentioned above and are summarized in the following: removal of the dummy emitter, formation of inside spacers (typically D- or L-shaped), depositing the emitter and patterning followed by patterning and etching of the extrinsic base and etching of the underlying HDP oxide.

Figure 5:
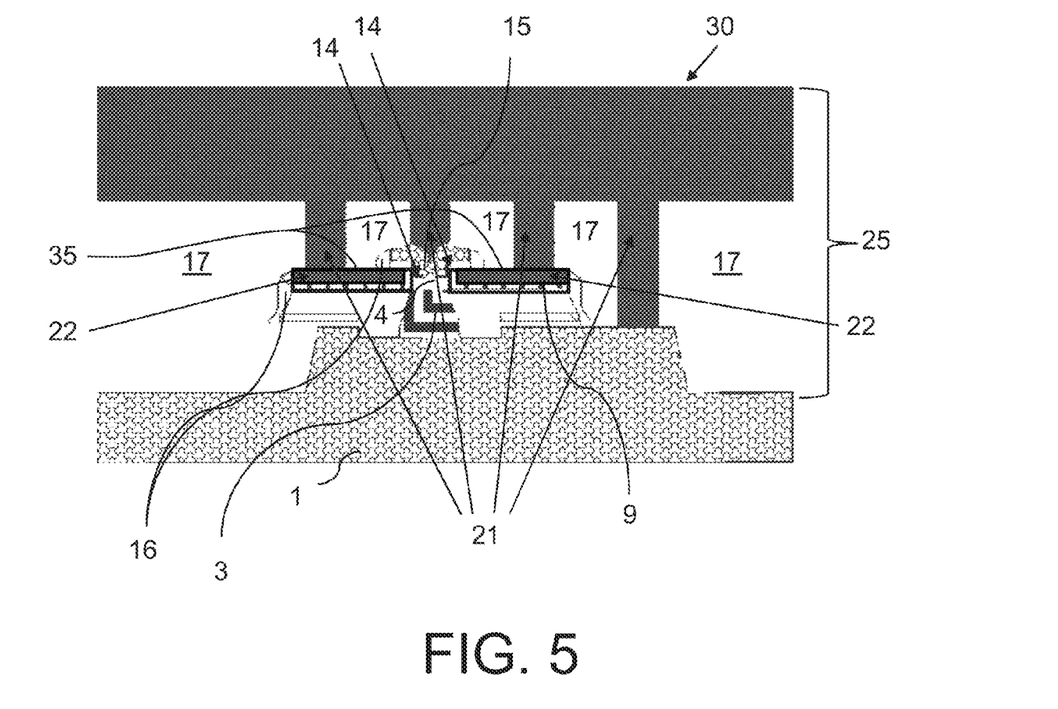
FIG. 5 shows the removal of a sacrificial poly-SiGe layer with dry etch according to the first embodiment of the invention.

In the following the metallic base formation is going to be described. After depositing the pre-metal dielectric (PMD) stack 17, shown in FIG. 5, the structure is planarized by applying a polishing process such as CMP. The PMD stack 17 comprises borophosphosilicate glass (BPSG) of 1090 thickness on a SiC layer of 50 nm thickness. The BPSG is used as an insulating layer between the W metal contacts and SiC is used as a stopping layer when the contacts are etched through BPSG. Then, contact holes and/or (contact) stripes 21, wherein the stripes typically allow better cavity feeling, are made through this PMD stack with an anisotropic etch such as a dry etch. As shown in FIG. 5, still illustrating the first embodiment, the sacrificial part of the extrinsic base, i.e. the poly-SiGe layer 10 or the undoped poly-Si layer 12 and $SiO_2$ layer 11, respectively, is removed leaving only the boron-doped poly-Si layer 9.

Accessing the sacrificial layer corresponds to the fact that the contact etch goes through the silicide on the extrinsic base while stopping on the emitter and collector. In this first embodiment this is done by using the difference in etch rate between contact holes and contact stripes. In another embodiment a layer such as a nitride layer is deposited on top of the sacrificial layer to prevent silicidation on the extrinsic base. This is performed before the first CMP step. The remaining boron-doped poly-Si layer 9 prevents the intrinsic base from being laterally etched during the sacrificial layer removal.

FIG. 5 also shows inside spacers 14 that are L-shaped in this embodiment. In another embodiment the inside spacers are D-shaped. The emitter region 15 is a doped poly-Si layer (in another embodiment it is a doped mono-Si layer) of 100 nm thickness. Spacers created by applying LPCVD followed by an anisotropic etch, such as dry etch, are so-called SINGEN spacers 16 and are shown in FIG. 5 as well.

Figure 6:
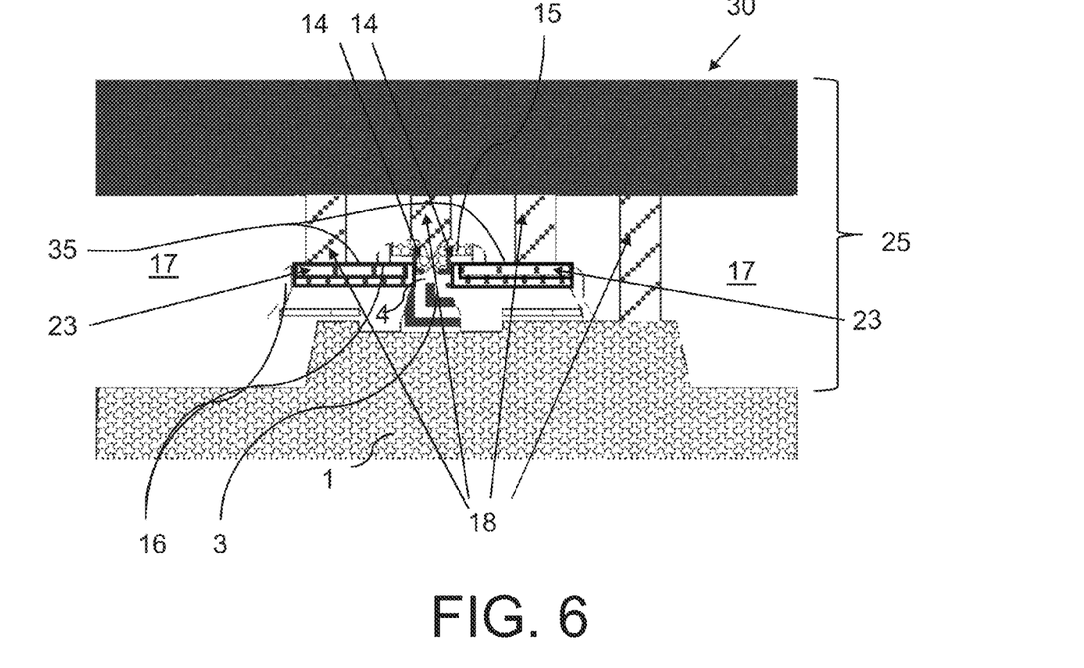
FIG. 6 shows W layer deposition according to the first embodiment of the invention.

According to standard BEOL processing, tungsten (W) 18, shown in FIG. 6, is deposited to fill the contact holes and/or contact stripes 21. An alternative metal could be used as long as a CVD process is involved for conformality reasons. Due to the good conformality of the W CVD process, the extrinsic base cavities 22 are at least partially filled which can be seen in FIG. 6. For the extrinsic base, the W is deposited on top of the boron-doped poly-Si layer 9 and forms a metal layer 23 within the extrinsic base region 35. The metal layer 23 shows a thickness of 350 nm after its deposition.

Figure 7:
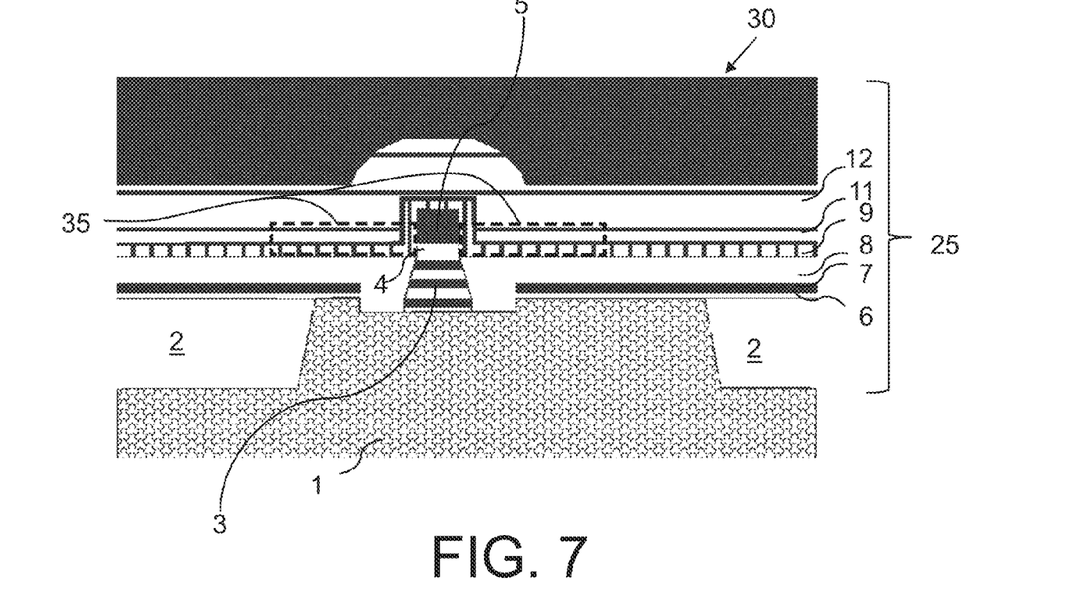
FIG. 7 shows a boron-doped poly-Si, silicon dioxide ($SiO_2$) and undoped poly-Si stack according to a second embodiment of the invention.
Figure 8:
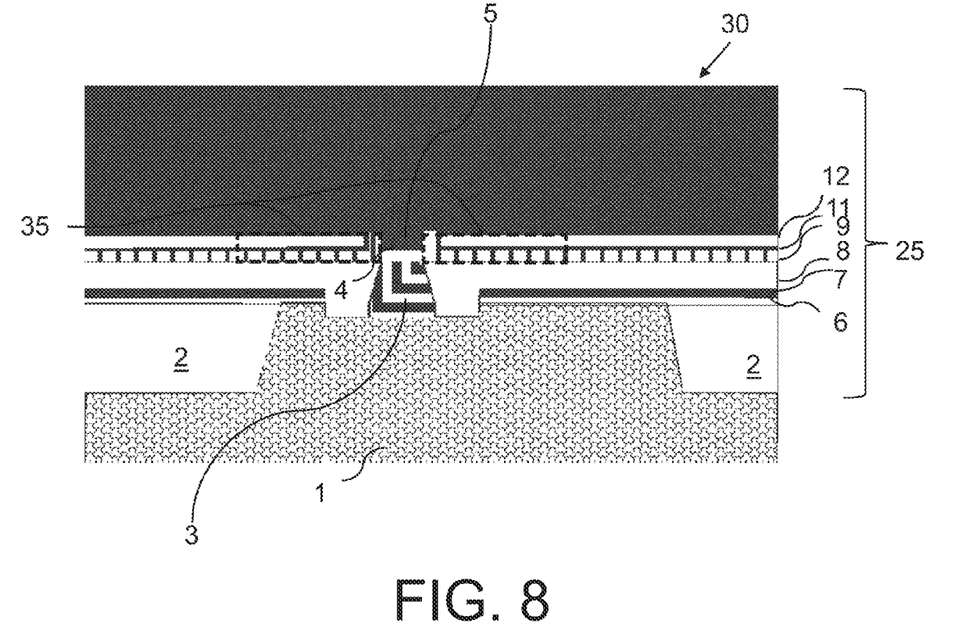
FIG. 8 illustrates poly-Si planarization and etch-back according to the second embodiment of the invention.
Figure 9:
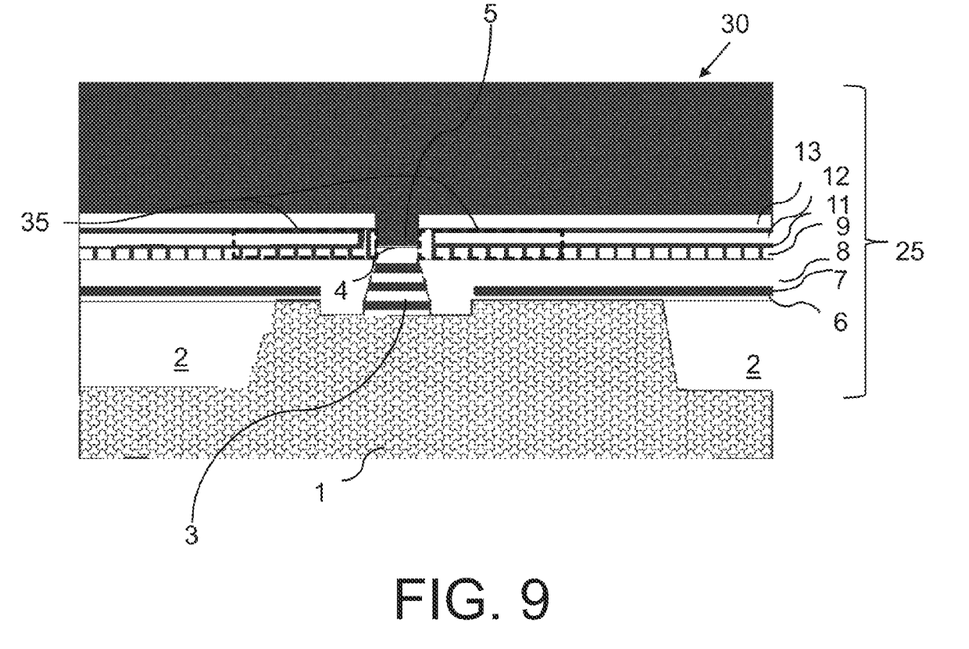
FIG. 9 illustrates HDP oxide deposition and planarization according to the second embodiment of the invention.
Figure 10:
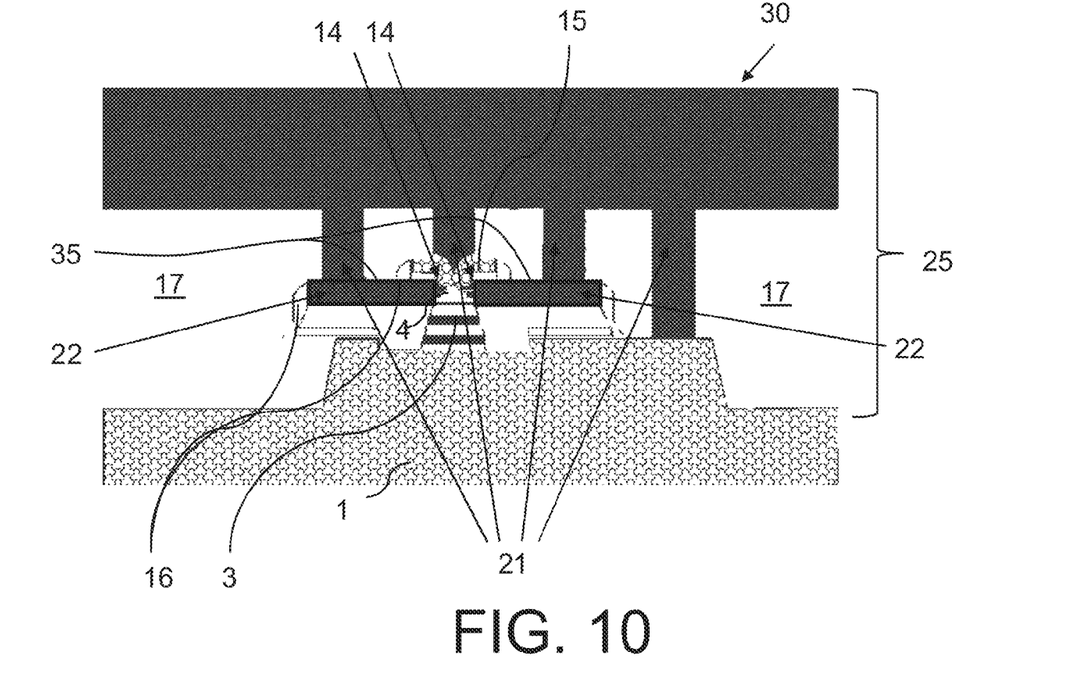
FIG. 10 illustrates the removal of a sacrificial layer with dry etch according to the second embodiment of the invention.
Figure 11:
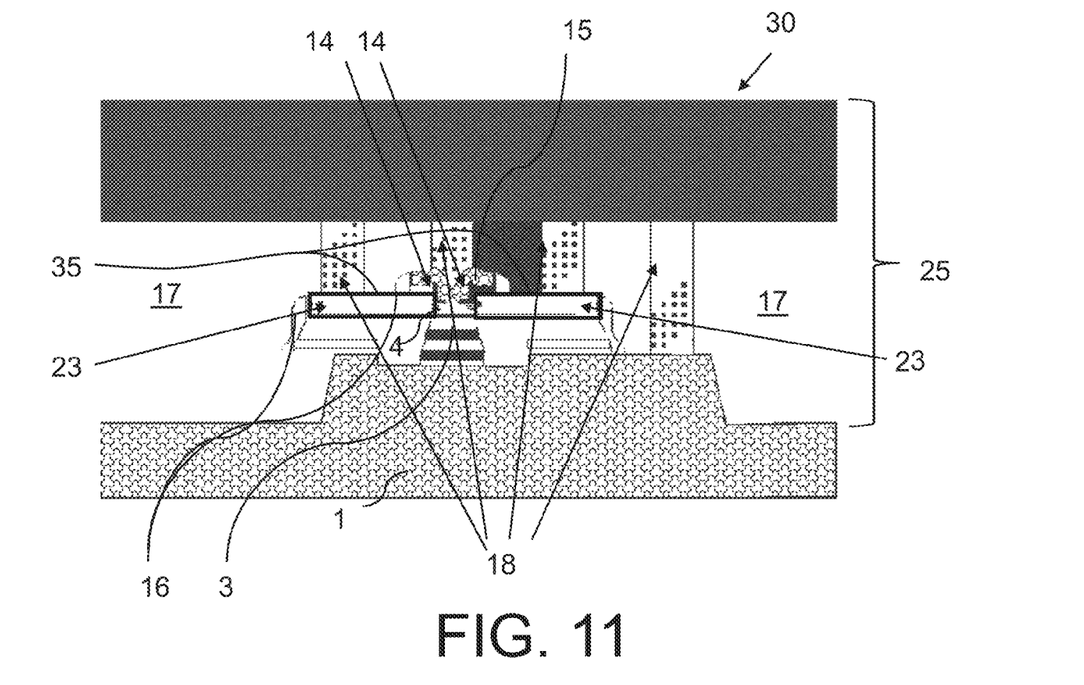
FIG. 11 shows W layer deposition according to the second embodiment of the invention.

FIG. 7 shows a second embodiment of the invention, corresponding to FIG. 2 of the first embodiment, but with a boron-doped poly-Si layer 9, a silicon dioxide ($SiO_2$) layer 11 and an undoped poly-Si layer 12 forming a stack in the extrinsic base region 35, as typically used in the integration of metal emitters. In this second embodiment, the undoped poly-Si layer 12 is removable. The silicon dioxide layer 11 has a thickness of 10 nm and the undoped poly-Si layer 12 a thickness of 350 nm. FIG. 8 (corresponds to FIG. 3) shows the situation after applying a dry etch to recess the poly-Si layer 9 to a level half-way the dummy emitter 5. FIG. 9 (corresponds to FIG. 4) depicts the deposition of an HDP oxide layer 13 and planarization of the whole structure with CMP. The remaining boron-doped poly-Si layer 9 prevents the intrinsic base from being laterally etched during the sacrificial layer removal. This is shown in FIG. 10, which corresponds to FIG. 5, as the poly-SiGe layer 10 etch is non-selective towards the intrinsic SiGe base which as a result is at least partially etched away leaving empty cavities 22. It is worth noting that in this second embodiment not only the extrinsic base is completely etched away but the intrinsic (SiGe) base 4 is attacked as well. Finally, FIG. 11 (corresponds to FIG. 6) illustrates that in this second embodiment the extrinsic base cavities 22 are completely filled and the cavities in the intrinsic SiGe layer 4 are also filled. The W layer 18 shows a thickness of 350 nm like in the first embodiment.

In the previous two embodiments spacers can be introduced to avoid a lateral etch of the intrinsic base. If these spacers are silicided they are adapted for providing a low contact resistance between the extrinsic and intrinsic base parts and avoid a direct metal/Si interface. In the following a third embodiment of the invention will be described in more detail.

Figure 12:
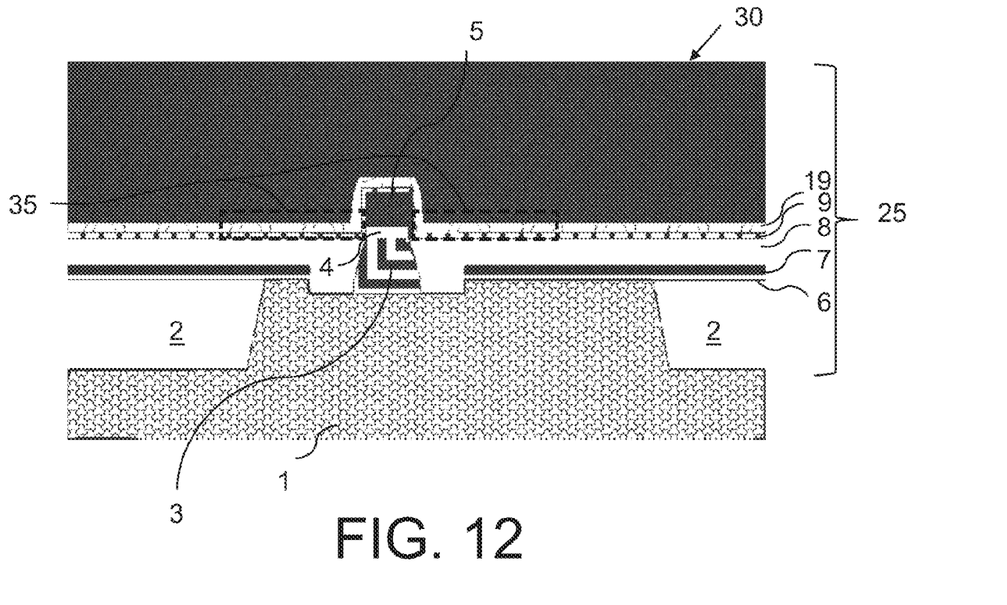
FIG. 12 illustrates poly-Si and metal layer deposition according to a third embodiment of the invention.

In this third embodiment spacers are introduced in the semiconductor device and in the method of manufacturing such a device, respectively. After HDP oxide planarization and etch-back, a boron-doped poly-Si layer 9 and a metal layer 19, which both form a stack, are deposited as shown in FIG. 12. The metal layer 19 shows a thickness of 20 nm in this third embodiment and is comprised by the extrinsic base region 35.

Figure 13:
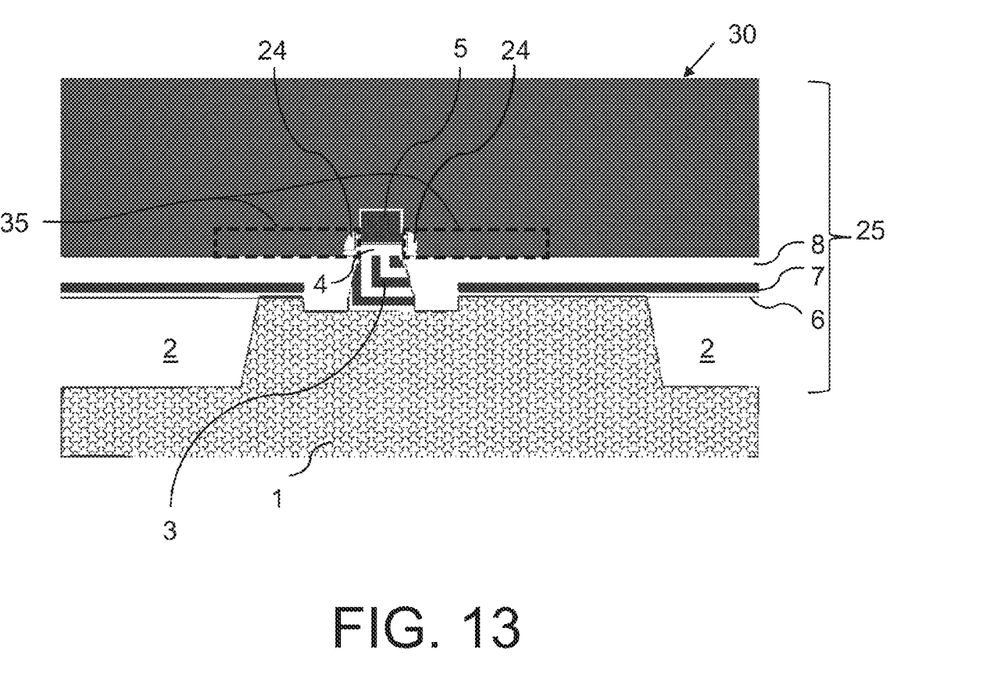
FIG. 13 illustrates the formation of metal/poly-Si spacers according to the third embodiment of the invention.
Figure 14:
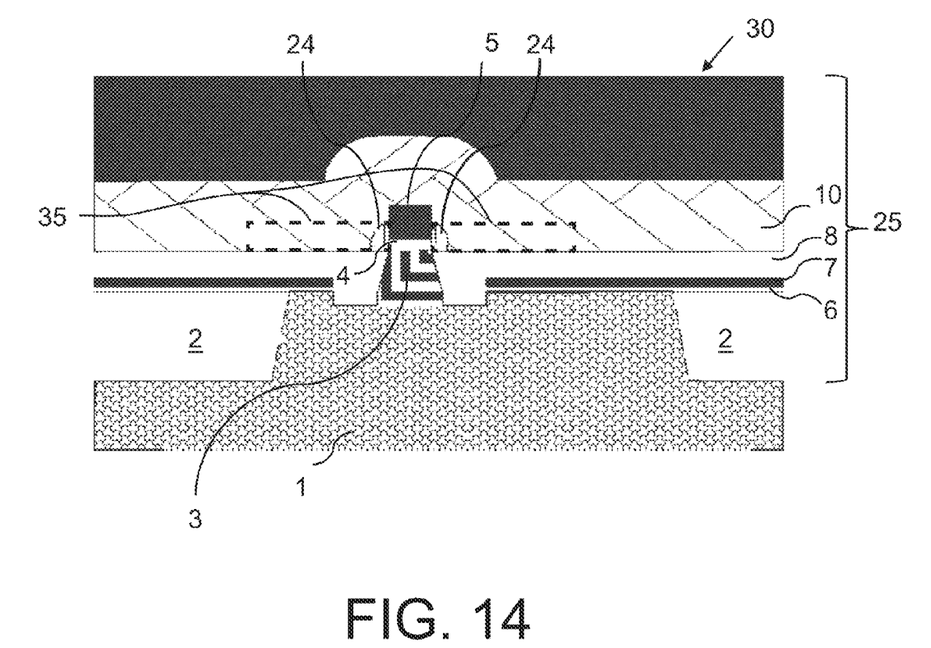
FIG. 14 depicts poly-SiGe layer deposition according to the third embodiment of the invention.
Figure 15:
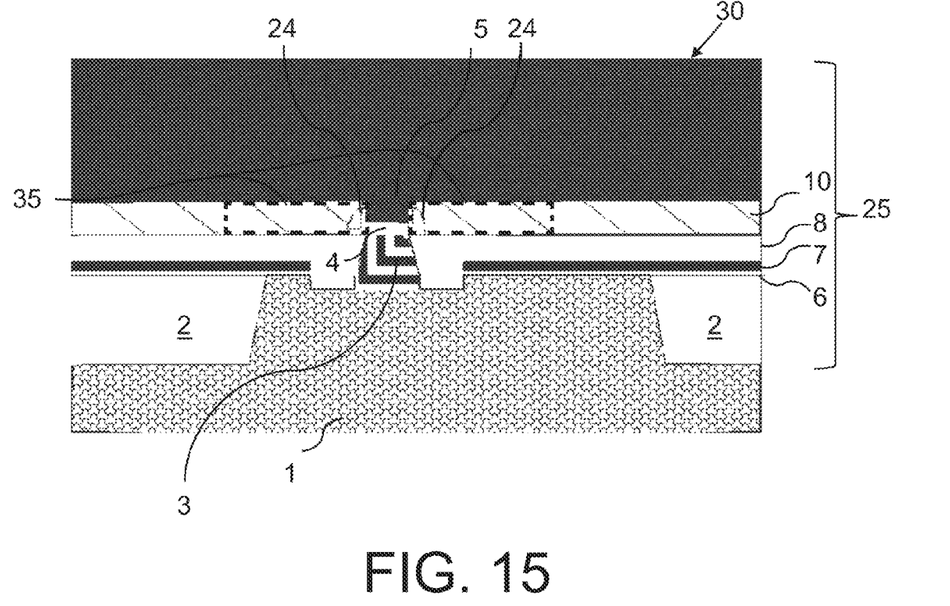
FIG. 15 shows poly-SiGe planarization and etch-back according to the third embodiment of the invention.

In FIG. 13 the formation of metal/poly-Si spacers 24 is illustrated according to the third embodiment of the invention. The formation is done by applying an anisotropic etch such as a dry etching. Afterwards a poly-SiGe layer 10 is deposited as shown in FIG. 14. Next, a polishing step such as CMP is used to planarize the layer stack down to or at least above the dummy emitter 5 top level. FIG. 15 shows the situation after applying a dry etch to recess the poly-SiGe layer 10 to a level half-way the dummy emitter 5.

Figure 16:
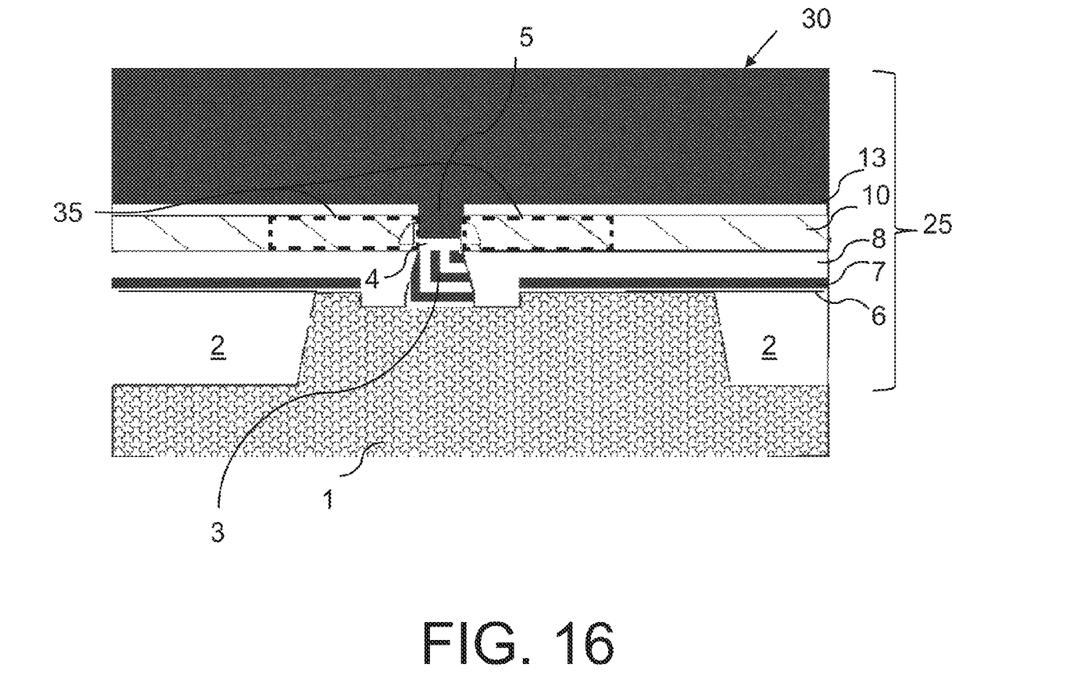
FIG. 16 shows HDP oxide deposition and planarization according to the third embodiment of the invention.
Figure 17:
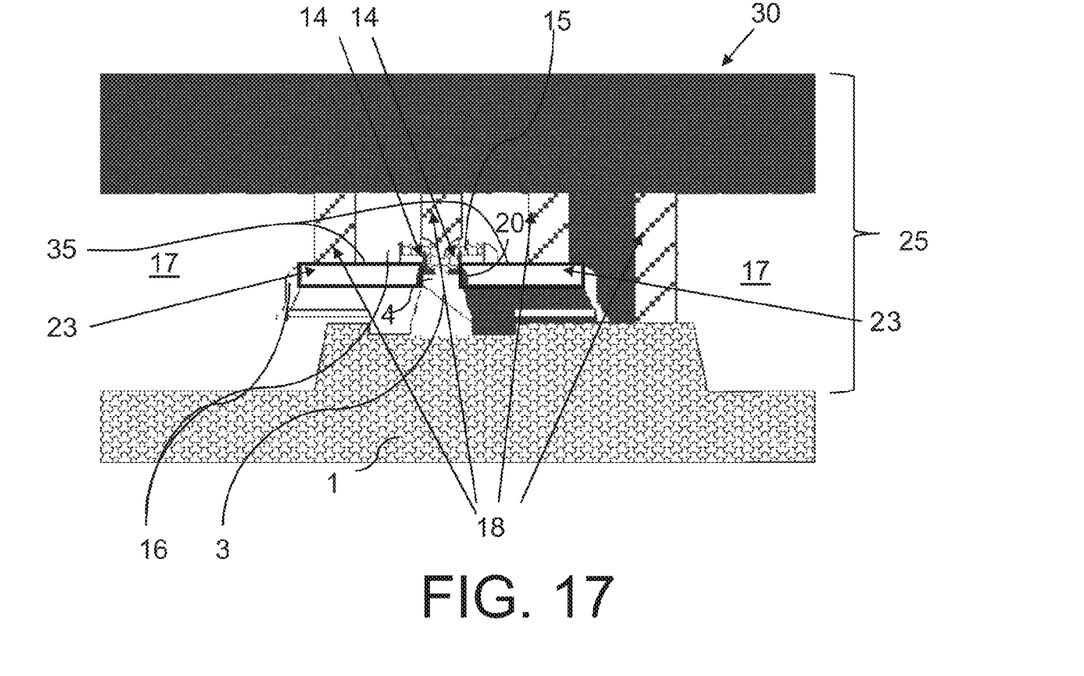
FIG. 17 shows W layer deposition according to the third embodiment of the invention.

An HDP oxide layer 13 is then deposited and planarized with a polishing step such as CMP as shown in FIG. 16. Again the FEOL processing steps are performed that have already been described above. During the bipolar and CMOS silicidation process, the metal/poly-Si spacers 24 also go through these processing steps and silicided spacers 20 are formed, as shown in FIG. 17. It is noted that the silicided spacers 20 remain stable during the activation anneal processing step. However, they are replaceable by a conformal W Si CVD layer since this layer withstands a high thermal budget and thus stability of the metal/poly-Si layers is not an issue.

It is worth noting that the process integration scheme in this third embodiment is identical to the integration schemes of the first and second embodiments: A PMD stack 17 is deposited and planarized. Then, contact holes and/or (contact) stripes 21 are etched through the PMD stack 17. The sacrificial poly-SiGe layer 10 is subsequently removed. Finally, as shown in FIG. 17, a W-layer 18 is deposited to fill the contact holes and/or stripes 21 and the extrinsic base cavities 22. In the embodiment of FIG. 17, the extrinsic base contains a tungsten layer 23.

Applying the invention leads to a continuous shift to higher RF frequencies. Preferred applications are amplifiers in 60 GHz WLAN and 77 GHz car radar systems. However, the invention can be applied to any application requiring high-frequency bipolar transistors, preferably heterojunction bipolar transistors, adapted for RF applications.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage.

A single unit may fulfil the functions of several items recited in the claims. Any reference signs in the claims should not be construed as limiting the scope.

The invention claimed is:

1. A method of manufacturing a bipolar transistor comprising the steps:
   a) forming a collector region on a substrate and forming an intrinsic base region on top of the collector region,
   b) forming a first isolation region surrounding at least a portion of the collector region, and
   c) forming an extrinsic base region including a metal layer, the extrinsic base region arranged adjacent to the intrinsic base region and in direct contact with the intrinsic base region,
   wherein the step of forming the extrinsic base region including the metal layer includes:
   forming a sacrificial layer arranged inside the extrinsic base region and at the top surface of the extrinsic base region,
   depositing a pre-metal dielectric layer on top of the sacrificial layer of the extrinsic base region,
   dry etching contact holes and/or contact stripes through the pre-metal dielectric layer to the top surface of the sacrificial layer, and
   removing the sacrificial layer and replacing the removed sacrificial layer of the extrinsic base region by a metal layer.

2. The method of manufacturing a bipolar transistor according to claim 1, further comprising before dry etching contact holes and/or contact stripes, planarizing the pre-metal dielectric layer by applying chemical mechanical planarization.

3. The method of manufacturing a bipolar transistor according to claim 2, wherein the step of replacing the removed sacrificial layer of the extrinsic base region by a metal layer further includes: depositing a metal on top of the extrinsic base region for filling the contact holes and/or contact stripes.

4. The method of manufacturing a bipolar transistor according to claim 1, before the step of depositing a pre-metal dielectric layer on top of the sacrificial layer: forming silicide spacers arranged inside the extrinsic base region and adjacent to the metal layer, where the silicide spacers are disposed between the metal layer and the intrinsic base region.

5. The method of manufacturing a bipolar transistor according to claim 2, before the step of depositing a pre-metal dielectric layer on top of the sacrificial layer: providing SIN-GEN spacers arranged adjacent to the extrinsic base region by applying LPCVD followed by an anisotropic etch.

6. The method of manufacturing a bipolar transistor according to claim 1, wherein the sacrificial layer includes poly-SiGe.

7. The method of manufacturing a bipolar transistor according to claim 1, wherein the sacrificial layer includes an undoped poly-Si layer.

8. The method of manufacturing a bipolar transistor according to claim 1, wherein the sacrificial layer includes an undoped poly-Si layer formed on top of a silicon dioxide layer.

9. The method of manufacturing a bipolar transistor according to claim 1, wherein the extrinsic base region includes a doped Si layer, where the sacrificial layer is formed on top of the doped Si layer.

10. The method of manufacturing a bipolar transistor according to claim 9, wherein a part of the doped Si layer of the extrinsic base region is formed to separate the sacrificial layer from the intrinsic base region, wherein the doped Si layer prevents the intrinsic base from being laterally etched during the sacrificial layer removal.

11. The method of manufacturing a bipolar transistor according to claim 2, wherein the step of removing the sacrificial layer includes: removing the sacrificial layer by etching through the contact holes and/or contact stripes, the removal of the sacrificial layer forming a cavity in the extrinsic base region.

12. The method of manufacturing a bipolar transistor according to claim 11, wherein the step of replacing the sacrificial layer includes: filling the cavity with a metal via the contact holes and/or contact stripes and forming the metal layer in the extrinsic base region.

13. The method of manufacturing a bipolar transistor according to claim 1, wherein the metal layer is in direct contact with the intrinsic base region.

14. The method of manufacturing a bipolar transistor according to claim 1, wherein the metal layer is in contact with the intrinsic base region via a silicide spacer.

15. The method of manufacturing a bipolar transistor according to claim 1, wherein the metal layer is in contact with the intrinsic base region via a doped poly-Si layer.

16. The method of manufacturing a bipolar transistor according to claim 9, wherein the extrinsic base region is separated from the emitter region by an oxide layer.

17. The method of manufacturing a bipolar transistor according to claim 3, wherein the deposited metal is tungsten and the metal layer is a tungsten layer.

\* \* \* \* \*